US007335896B2

(12) United States Patent
Pilz et al.

(10) Patent No.: US 7,335,896 B2
(45) Date of Patent: Feb. 26, 2008

(54) EMITTER FOR AN ION SOURCE (75) Inventors: Wolfgang Pilz, Dresden (DE); Lothar Bischoff, Dresden (DE)

(73) Assignee: ICT, Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 310 days.

(21) Appl. No.: 11/190,043

(22) Filed: Jul. 26, 2005

(65) Prior Publication Data

US 2006/0022143 A1   Feb. 2, 2006

(30) Foreign Application Priority Data

Jul. 28, 2004   (EP)   ................................ 04017894

(51) Int. Cl.
*H01J 27/00* (2006.01)
(52) U.S. Cl. ................................ 250/423 R; 313/362.1; 313/163
(58) Field of Classification Search ............ 250/423 R; 313/362.1, 163

See application file for complete search history.

(56) References Cited

U.S. PATENT DOCUMENTS 4,488,045 A    12/1984    Anazawa et al.

FOREIGN PATENT DOCUMENTS

| DE | 100 39 327 A1 | 2/2002 |
|----|---------------|--------|
| DE | 102 44 862 A1 | 4/2004 |
| EP | 0620 582 A1   | 2/1994 |
| JP | 60-216432     | 10/1985 |
| JP | 07-320670     | 12/1995 |
| JP | 10-064438     | 3/1998 |
| JP | 10-506497     | 6/1998 |
| JP | 11-067116     | 3/1999 |
| WO | WO96/02065    | 1/1996 |

OTHER PUBLICATIONS

Chao, et al, "Rare Earth Focused Ion Beam Implantation Utilizing Er and Pr Liquid Alloy Ion Sources," American Vacuum Society 1999.
Machalett, et al, "Investigations on Liquid Alloy Ion Sources for Rare-earth Elements[a])," American Institute of Physics 1998.
Cheng, et al, "Fabrication of $PrSi_2$ Layers and Associated Morphology on Si Surface By A Single-Step High Current Pr-Ion Implantation," Journal of Alloy and Compounds 345 (2002) 252-256.
Papadopoulos, "A Study Of The Liquid Pr-Ion Source," IOP Publishing LTD 1987.
Machalett, et al, "Praseodymium Alloy Ion Source For Focused Ion Beam Implantation In Superconductors," American Institute of Physics 1996.
Osten, et al, "Epitazial Praseodymium Oxide: A New High-*K* Dielectric," IWGI 2001, Tokyo.
"Focused Ion Beam Technology," IBM Oct. 25, 2002.
Application No. EP 04 01 7894, European Search Report, Mar. 21, 2005 "ICT Integrated Circuit Testing."

*Primary Examiner*—Jack I. Berman
*Assistant Examiner*—Michael J Logie
(74) *Attorney, Agent, or Firm*—Patterson & Sheridan, LLP (57) ABSTRACT

An emitter for an ion source, such as a liquid metal alloy ion source (LMAIS). The emitter includes a binary alloy PrSi as a source material.

23 Claims, 6 Drawing Sheets

EMITTER FOR AN ION SOURCE

CROSS-REFERENCE TO RELATED APPLICATIONS

This application claims benefit of co-pending European patent application Serial No. EP 04017894.9 filed Jul. 28, 2004, and is herein incorporated by reference in its entirety.

BACKGROUND OF THE INVENTION

1. Field of the Invention

Embodiments of the present invention generally relate to an emitter for an ion source and, particularly, an emitter for a liquid metal alloy ion source (LMAIS).

2. Description of the Related Art

Focused ion beam (FIB) technology is an important tool for the semiconductor industry. Focused ion beams are used for failure analysis, transmission electron microscopy specimen preparation, and circuit and mask modification. FIB micro and nanofabrication may be utilized to reduce the complexity required in conventional fabrication technology, such as lithography, etching and implantation, which may need to satisfy various requirements for different components fabricated on the same substrate.

Figure 6:
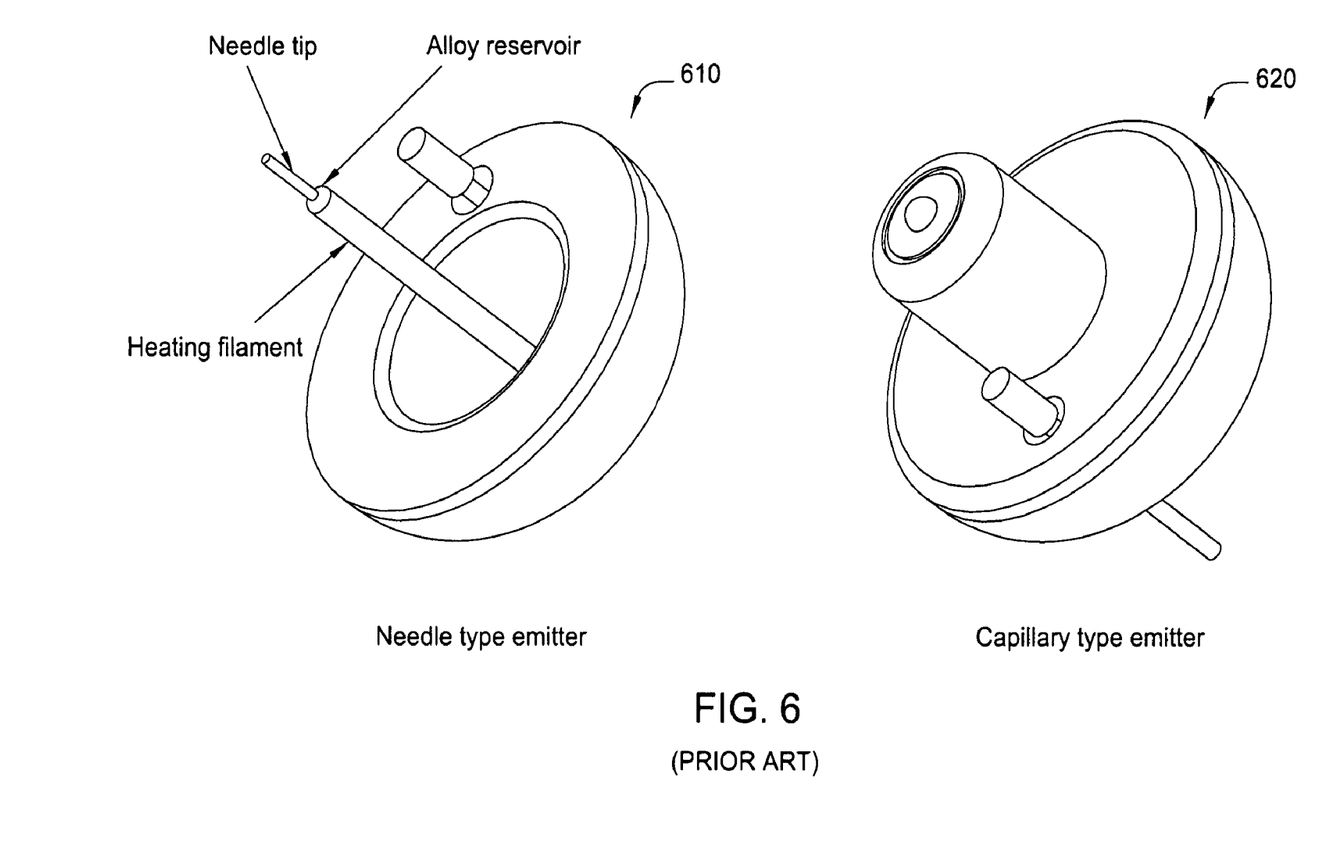
FIG. 6 illustrates an emitter of the filament and hairpin type and an emitter of the capillary type.

The success of FIB technology is due to the invention of liquid metal ion sources (LMIS). In an LMIS, a tiny hairpin and a filament, typically made of W, Ta, Ti or Ni, are typically used as an emitter, such as emitter 610 shown in FIG. 6. Other types of emitters, such as reservoir type emitters with and without hairpin and porous emitters are also known. For example, emitter 620 of the capillary type is shown on the right hand side of FIG. 6.

The emitter is typically wetted and loaded with a source material. For wetting, as well as during operation of the source, the source material is typically provided in liquid form. To this end, a resistance heater or an electron beam heater may be used. High voltage is then applied between the emitter tip and a counter electrode. Due to the high electric field strength at the emitter tip, an even smaller tip of liquid source material forms at the emitter tip and ions are emitted therefrom. Thereby, a stable ion beam is generated from the source material.

Typically, the source material has to fulfill several physical and chemical requirements. It is important, therefore, that the source material is metallic, has a relatively low melting point and a low vapour pressure. It is also important that the source material has good wetting properties with respect to the material of the filament.

Rare earth metals are widely used for laser and optical communications applications. Among the rare earths, praseodymium (Pr) has drawn a lot of interest because of the emission at 1.3 μm, which corresponds to a wavelength for minima in absorption and dispersion in silica optical fibers. Furthermore, Pr is used in Si or GaAs semiconductors. Particularly, DE 100 39 327 A1 describes the use of $Pr_2O_3$ as a gate oxide in MOSFETs for further reduction of the gate length. Also, implantation of Pr ion in high-$T_c$ superconductors for the formation of Josephson junctions is reported in "Praseodymium alloy ion source for focused ion beam implantation in superconductors" by F. Machalett et al., Rev. Sci. Instrum. 67 (3), 1996.

However, in "A study of the liquid Pr-ion source", Phys. D, 20 (1987), p. 1302, S. Papadopoulos reports a poor wettability of tungsten by liquid Pr at temperatures near the melting point. In addition, when exposed to air, the liquid Pr rapidly oxidizes to $Pr_2O_3$, one of the most refractory substances known.

Therefore, the authors of "Praseodymium alloy ion source for focused ion beam implantation in superconductors", Rev. Sci. Instrum. 67 (3), 1996, used the ternary alloy Au—Si—Pr as a source material. However, Au is an improper source material for semiconductor industry. Due to its rapid diffusion, Au quickly disperses within the semiconductor material and alters the conductivity in an uncontrollable manner.

In "Rare earth focused ion beam implantation utilizing Er and Pr liquid alloy ion sources" by L.C. Chao et al., J. Vac. Sci. Technol. B 17(6), November/December 1999, a liquid metal alloy ion source (LMAIS) with binary alloys PrPt and PrAg on a tungsten wire is described. However, these source materials may also introduce Pt or Ag impurities into the semiconductor material.

Finally, EP 0 620 582 describes the use of the binary alloy CoPr for a Co ion source. However, the Pr is only used to lower the melting point in this application.

Therefore, a need exists in the art for a new emitter for an ion source and a method for producing thereof.

SUMMARY OF THE INVENTION

Various embodiments of the invention are generally directed to an emitter for an ion source, wherein the emitter comprises a binary alloy PrSi.

Various embodiments of the invention are also generally directed to a method for producing an emitter for an ion source. The method includes providing a filament and a hairpin, providing a melt of PrSi, wetting the filament and the hairpin with the melt of PrSi, and loading the filament and the hairpin with a droplet of the melt of PrSi after the filament and the hairpin have been wetted with the melt of PrSi.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

According to a first aspect of the present invention, an emitter for an ion source is provided, wherein the emitter includes a binary alloy PrSi as a source material. Thus, only Pr and Si ions as well as a small amount of cluster and molecular ions are generated by the ion source according to this aspect of the present invention. No impurities should be introduced into semiconductor materials when they are processed with an ion beam generated by this ion source. Furthermore, Pr ions may be much heavier than Si ions. Accordingly, when structuring semiconductor surfaces, Pr may be used for quick surface degradation, whereas the lighter Si ions may be used for fine degradation. Thus, the binary alloy PrSi allows for fast and fine surface degradation with a single ion source. Finally, in contrast to pure Pr binary alloy, PrSi is sufficiently stable when exposed to air so that the PrSi ion source may be readily manufactured and mounted.

According to an embodiment of the present invention, the emitter includes a filament and a hairpin that are preferably made of tungsten or tantalum. The filament/hairpin is coated with a layer of silicon. The coating may be performed by sputtering. This silicon coating is configured to improve the wetting property of the filament/hairpin material with respect to the PrSi such that the emitter is readily wetted and loaded with the PrSi source material. Notably, the temperature necessary for wetting is much lower when the silicon layer is coated on the filament/hairpin. Furthermore, the use of silicon for this coating layer ensures that no impurities are introduced into a silicon semiconductor material, even when material from the coating layer is emitted.

According to another embodiment of the present invention, the silicon coating layer has a thickness in the range of about 100 nm to about 1500 nm. This ensures that the microstructure of the filament/hairpin is maintained. On one hand, the silicon coating layer is sufficiently thin so that microgrooves formed on the filament/hairpin for transporting liquid source material to the emitter tip are not clogged. On the other hand, the silicon coating has a sufficient thickness so that the material of the filament/hairpin is completely coated and also stays coated during operation.

According to another aspect of the present invention, a method of manufacturing an emitter for an ion source is provided. The method includes providing a filament/hairpin, a binary alloy PrSi in a molten (liquid) state, wetting the filament/hairpin with the liquid PrSi, and loading the filament/hairpin with a droplet of the liquid PrSi.

The following paragraphs describe a method for manufacturing an emitter for an ion source in accordance with a first embodiment of the invention. Filament and hairpin are manufactured from a tungsten wire of about 0.2 mm thickness and then spot-welded to each other. The tip of the hairpin is lapped and microgrooves extending towards the tip are created for transporting liquid source material to the tip. A silicon coating layer of about 700 nm thickness may then be sputtered on the filament and the hairpin.

The method further includes providing a PrSi source material with about 11% Si and about 89% Pr. The PrSi source material may be molten in high vacuum within a directly heated tantalum crucible. The eutectic PrSi alloy has a melting point of about 732° C. It is an advantage of the eutectic PrSi alloy that the melting point is lower than for all other proportions of Pr and Si. Furthermore, this proportion of Pr and Si may also be constantly maintained in the ion beam so that none of the ingredients may be completely consumed before the other.

Then, the preheated coated filament and hairpin may be brought in contact with the eutectic PrSi melt. Due to cohesiveness, liquid PrSi material may start to flow onto the filament and the hairpin and, thus, a thin layer of liquid PrSi may form on the filament and the hairpin. Thus, the coated filament and hairpin may be wetted with the liquid PrSi alloy. Subsequently, the wetted filament and hairpin may be loaded with a droplet of liquid PrSi. Typically, the droplet has a volume of about 1 mm$^3$ to about 3 mm$^3$. Wetting and loading may be accomplished in a range from about 732° C. to about 1100° C.

Figure 1:
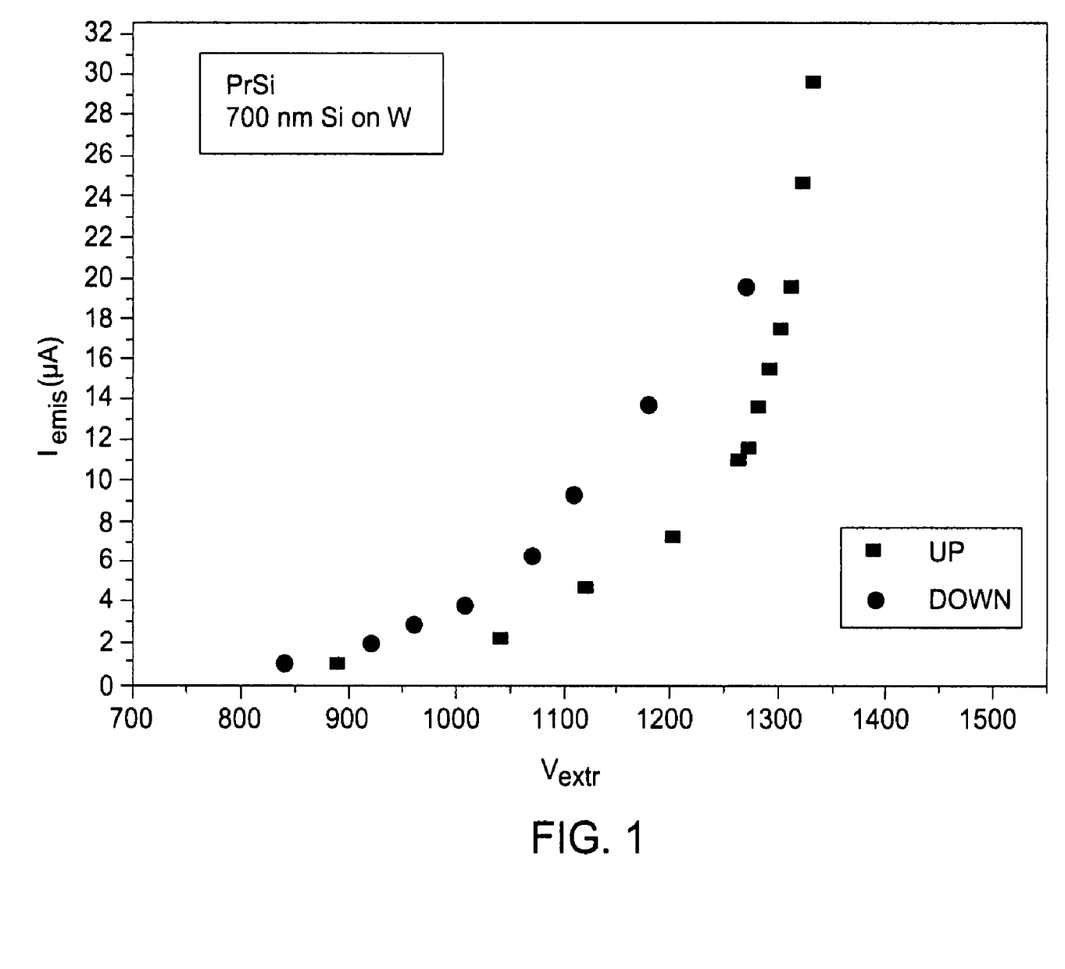
FIG. 1 illustrates a characteristic curve of an emitter according to one of more embodiments of the present invention.

The characteristic curve of the first embodiment is illustrated in FIG. 1. Therein, squares indicate the beam current when the extraction voltage is increased and circles indicate the beam current when the extraction voltage is decreased.

The beam current characteristic shown in FIG. 1 is not steep such that the beam current of the source may be effectively controlled within the range of about 1 µA to about 30 µA. In addition, the onset voltage of the ion source is quite moderate.

Figure 2:
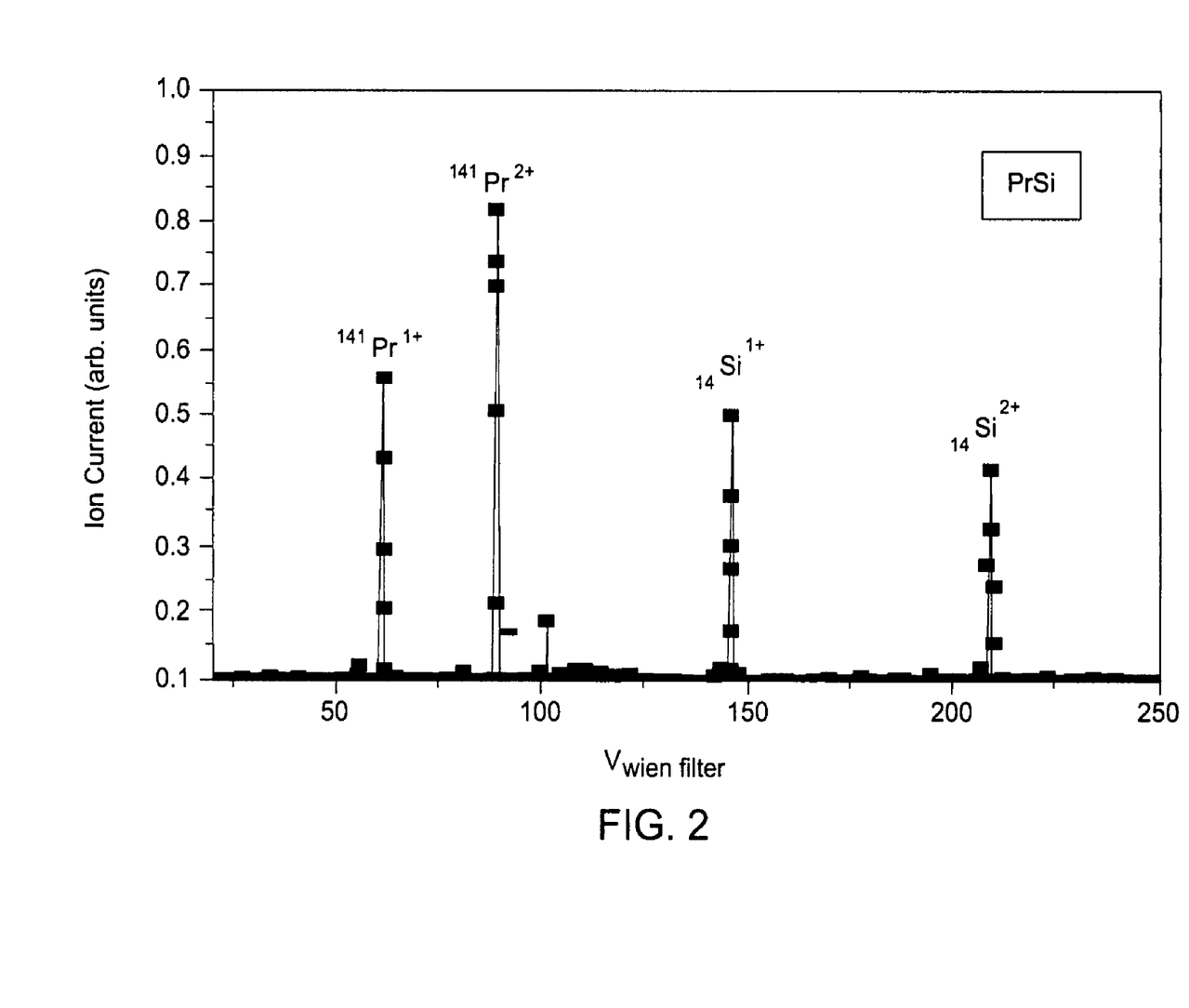
FIG. 2 illustrates the mass spectrum of an ion beam generated according to one of more embodiments of the present invention.

FIG. 2 illustrates a mass spectrum of the PrSi emitter according to the first embodiment of the invention. Therein, it is shown that $^{141}$Pr$^{1+}$ and $^{141}$Pr$^{2+}$ ions form the main fraction as it is expected from the proportion of Pr and Si in the binary alloy. Also, $^{28}$Si$^{1+}$ and $^{28}$Si$^{2+}$ ions are the dominant Si ion species.

Figure 3:
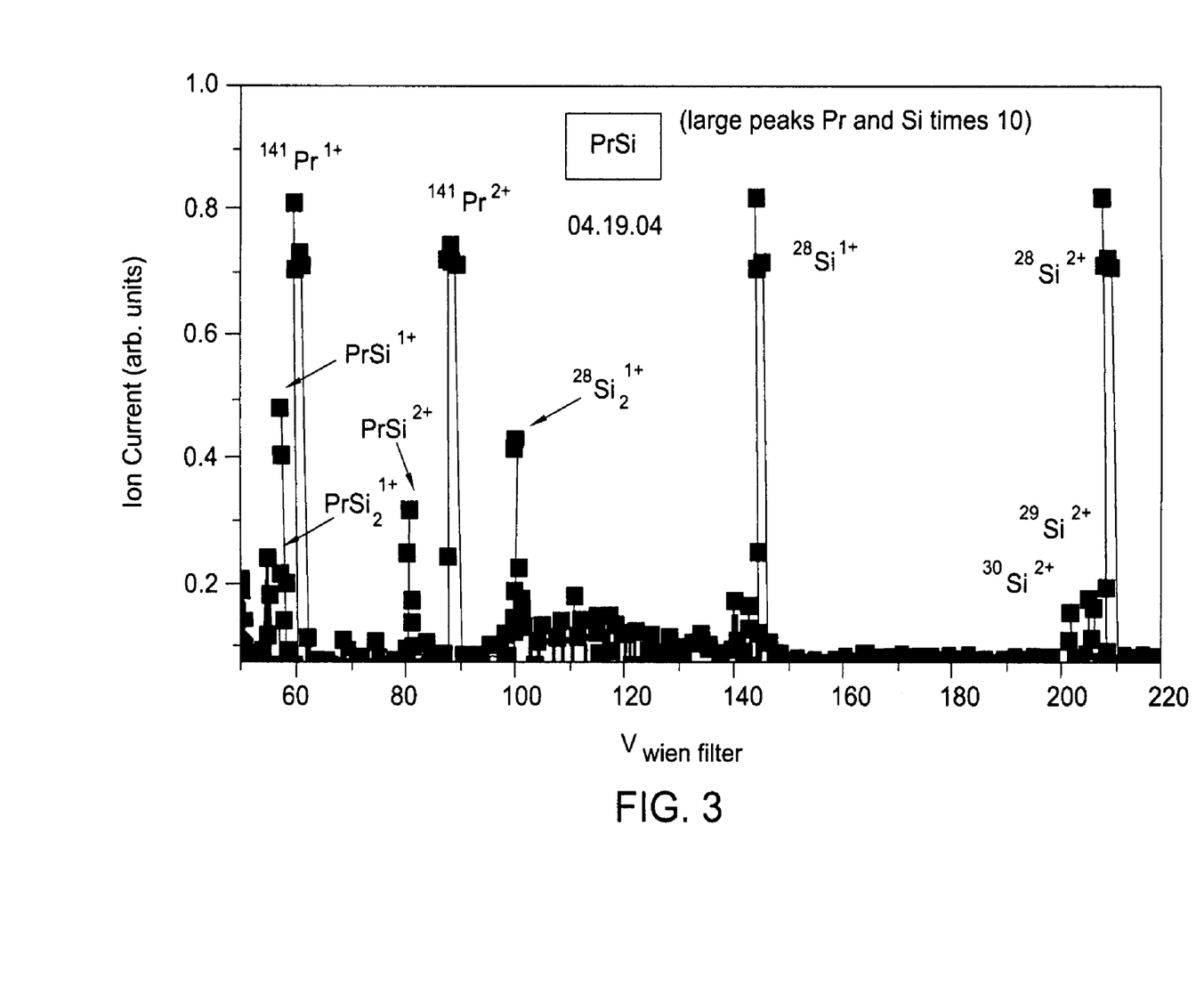
FIG. 3 illustrates a magnification of the lower part of the mass spectrum shown in FIG. 2.

FIG. 3 illustrates a more differentiated analysis of the mass spectrum of FIG. 2 in that it presents an enlarged view of the smaller fractions of ion species contained in the ion beam. Therein, the $^{29}$Si$^{2+}$ and $^{30}$Si$^{2+}$ ions of the Si line are clearly visible. FIG. 2 illustrates that the ion beam contains ionized $^{28}$Si$_2$$^{1+}$, PrSi$^{1+}$, PrSi$^{2+}$ and even PrSi$_2$$^{1+}$ molecules. It should be noted that only a single isotope of $^{141}$Pr exists.

The following paragraphs describe a method for manufacturing an emitter for an ion source in accordance with a second embodiment of the invention. Filament and hairpin are manufactured from a tungsten wire of 0.2 mm thickness and then spot-welded to each other. The tip of the hairpin is lapped and microgrooves extending towards the tip are created for transporting liquid source material to the tip. Subsequently, a silicon coating layer of 500 nm thickness may be sputtered on the filament/hairpin.

A PrSi source material is provided with about 11% Si and about 89% Pr. It may be molten in high vacuum within a directly heated tungsten crucible.

The preheated coated filament and hairpin may then be brought into contact with the eutectic PrSi melt. Due to cohesiveness, liquid PrSi material may start to flow onto the filament and the hairpin and, thus, a thin layer of liquid PrSi may form on the filament and the hairpin. Thus, the coated filament and hairpin may be wetted with the liquid PrSi alloy. Subsequently, the wetted filament and hairpin are loaded with a droplet of liquid PrSi. Typically, the droplet has a volume of about 1 mm$^3$ to about 3 mm$^3$. Wetting and loading may be accomplished in a range from about 732° C. to about 1100° C.

The emitter may be heated with a heating current of about 3.0 A in a vacuum of about $1 \cdot 10^{-6}$ Torr. An extraction voltage in the range of about 3.0 kV to about 4.0 kV may be applied to generate emission currents in the range of about 5 µA to about 30 µA. The mass spectrum of this embodiment is almost identical to the one shown in FIGS. 2 and 3.

After most of the first PrSi loading is consumed due to ion emission, a second loading of the same emitter is accomplished. The emitter may be heated with a heating current of about 3.2 A in a vacuum of about $8 \cdot 10^{-6}$ Torr. An extraction voltage in the range of about 2.8 kV to about 3.8 kV may be applied to generate emission currents in the range of about 3 μA to about 20 μA. Also, the mass spectrum of the second loading is almost identical to the one shown in FIGS. 2 and 3.

Thus, an emitter according to one or more embodiments of the present invention may be reused.

The following paragraphs describe a method for manufacturing an emitter for an ion source in accordance with a third embodiment of the invention. Filament and hairpin are manufactured from a tungsten wire of about 0.2 mm thickness and then spot-welded to each other. The tip of the hairpin is lapped and microgrooves extending towards the tip are created for transporting liquid source material to the tip. Subsequently, a gold coating layer of about 300 nm thickness may be evaporated on the filament and the hairpin.

A PrSi source material is provided with about 11% Si and about 89% Pr. It may be molten in high vacuum within a directly heated tantalum crucible. Then, the preheated coated filament and hairpin are brought in contact with the eutectic PrSi melt. Due to cohesiveness, liquid PrSi material may start to flow onto the filament and the hairpin and, thus, a thin layer of liquid PrSi may form on the filament and the hairpin. Thus, the coated filament and hairpin may be wetted with the liquid PrSi alloy. Subsequently, the wetted filament and hairpin are loaded with a droplet of liquid PrSi. Typically, the droplet may have a volume of about 1 mm$^3$ to about 3 mm$^3$. Wetting and loading may be accomplished in a range from about 732° C. to about 1100° C.

Figure 4:
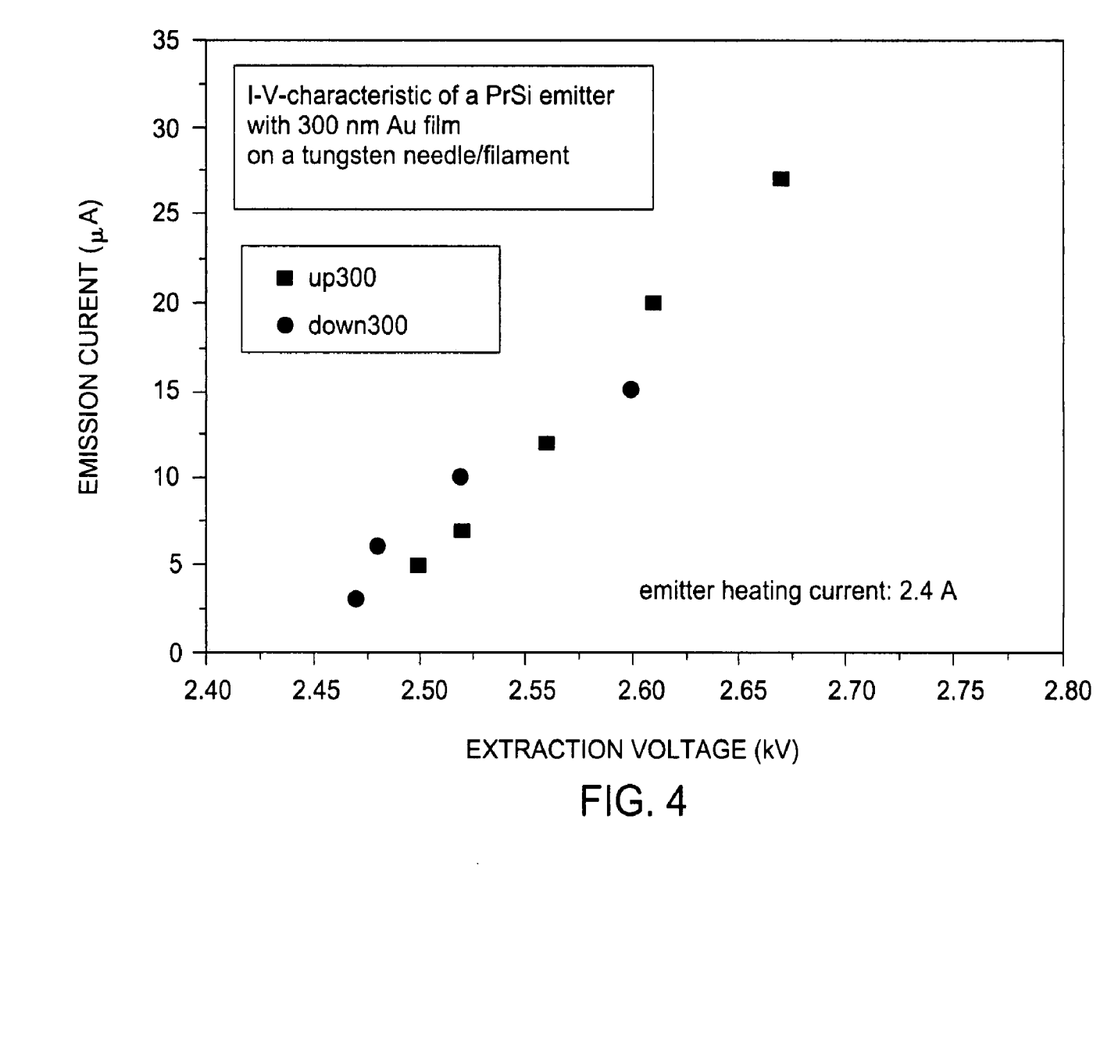
FIG. 4 illustrates a characteristic curve of an emitter according to one of more embodiments of the present invention.

The characteristic curve of the third embodiment of the invention is shown in FIG. 4. Therein, squares indicate the beam current when the extraction voltage is increased and circles indicate the beam current when the extraction voltage is decreased. The beam current characteristic shown in FIG. 4 is almost linear so that the beam current of the source may be effectively controlled within the range of about 5 μA to about 30 μA. However, the onset voltage of the ion source is higher than in the first embodiment.

The following paragraphs describe a method for manufacturing an emitter for an ion source in accordance with a fourth embodiment of the invention. Filament and hairpin are manufactured from a tungsten wire of about 0.2 mm thickness and then spot-welded to each other. The tip of the hairpin is lapped and microgrooves extending towards the tip are created for transporting liquid source material to the tip. Subsequently, a gold coating layer of about 500 nm thickness may be evaporated on the filament and the hairpin.

A PrSi source material is provided with about 11% Si and about 89% Pr. It may be molten in high vacuum within a directly heated tantalum crucible. Then, the preheated coated filament and hairpin are brought in contact with the eutectic PrSi melt. Due to cohesiveness, liquid PrSi material may start to flow onto the filament and the hairpin and, thus, a thin layer of liquid PrSi may form on the filament and the hairpin. Thus, the coated filament and hairpin are wetted with the liquid PrSi alloy. Subsequently, the wetted filament and hairpin are loaded with a droplet of liquid PrSi. Typically, the droplet has a volume from about 1 mm$^3$ to about 3 mm$^3$. Wetting and loading may be accomplished in a range from about 732° C. to about 1100° C.

Figure 5:
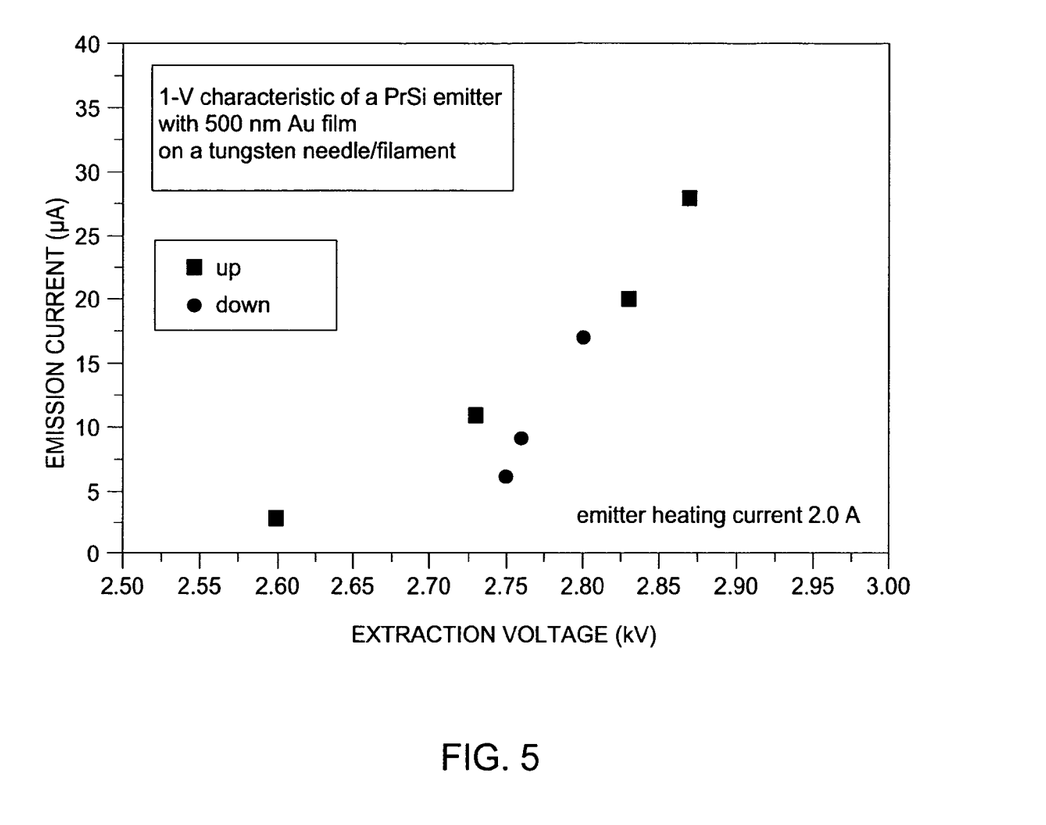
FIG. 5 illustrates a characteristic curve of an emitter according to one of more embodiments of the present invention.

The characteristic curve of the fourth embodiment of the invention is shown in FIG. 5. Therein, squares indicate the beam current when the extraction voltage is increased and circles indicate the beam current when the extraction voltage is decreased. The beam current characteristic shown in FIG. 5 is not steep so that the beam current of the source may be effectively controlled within the range from about 2.5 μA to about 30 μA. However, the onset voltage of the ion source is higher than in the third embodiment.

While the foregoing is directed to embodiments of the present invention, other and further embodiments of the invention may be devised without departing from the basic scope thereof, and the scope thereof is determined by the claims that follow.

What is claimed is:

1. An emitter for an ion source, wherein the emitter comprises a binary alloy PrSi.

2. The emitter of claim 1, wherein the PrSi binary alloy is of the form $Pr_xSi_{1-x}$, and $x=0.89\pm0.10$.

3. The emitter of claim 1, wherein the PrSi binary alloy is eutectic.

4. The emitter of claim 1, wherein the emitter is one of a type having a filament and a hairpin, a reservoir type with a hairpin, a reservoir type without a hairpin or a porous type.

5. The emitter of claim 4, wherein at least one of the filament or the hairpin is made of at least one of tungsten, tantalum, titanium or nickel.

6. The emitter of claim 4, wherein at least one of the filament or the hairpin is coated with an intermediate layer.

7. The emitter of claim 6, wherein the intermediate layer comprises silicon as a predominant component.

8. The emitter of claim 6, wherein the intermediate layer comprises gold as a predominant component.

9. The emitter of claim 6, wherein the intermediate layer has a thickness in a range from about 100 nm to about 1500 nm.

10. The emitter of claim 6, wherein the intermediate layer has a thickness of one of about 300 nm, about 500 nm or about 700 nm.

11. The emitter of claim 4, wherein the emitter is of the porous type and the granules are coated with Si or Au prior to processing.

12. The emitter of claim 4, wherein the hairpin and the filament comprise microgrooves extending in a direction towards the needle tip.

13. The emitter of claim 12, wherein the microgooves are generated by etching or grinding.

14. A method for producing an emitter for an ion source, comprising:
providing a filament and a hairpin;
providing a melt of PrSi;
wetting the filament and the hairpin with the melt of PrSi; and
loading the filament and the hairpin with a droplet of the melt of PrSi after the filament and the hairpin have been wetted with the melt of PrSi.

15. The method of claim 14, wherein the molten PrSi binary alloy is of the form $Pr_xSi_{1-x}$, and $x=0.89\pm0.10$.

16. The method of claim 14, wherein the molten PrSi binary alloy is eutectic.

17. The method of claim 14, wherein at least one of the filament and the hairpin is made of at least one of tungsten, tantalum, titanium or nickel.

18. The method of claim 14, wherein at least one of the filament and the hairpin is coated with an intermediate layer prior to the wetting of the filament and the hairpin.

19. The method of claim 18, wherein the intermediate layer comprises one of silicon or gold as a predominant component.

20. The method of claim 19, wherein the intermediate layer has a thickness in a range from about 100 nm to about 1500 nm.

21. The method of claim 18, wherein the intermediate layer has a thickness of one of about 300 nm, about 500 nm or about 700 nm.

22. The method of claim 18, wherein the intermediate layer is generated on the filament and the hairpin by sputtering or evaporation.

23. The method of claim 14, wherein the wetting and loading of the filament and the hairpin are accomplished at temperatures in a range from about 732° C. to about 1100° C.

* * * * *